United States Patent [19]

Kato et al.

[11] 4,039,829
[45] Aug. 2, 1977

[54] STEREOSCOPIC MEASURING APPARATUS

[75] Inventors: Yasuo Kato, Kodaira; Masahide Okumura, Tokyo; Hideo Todokoro, Hachioji, all of Japan

[73] Assignee: Hitachi, Ltd., Japan

[21] Appl. No.: 686,298

[22] Filed: May 14, 1976

[30] Foreign Application Priority Data

May 19, 1975  Japan ............................ 50-58592

[51] Int. Cl.$^2$ .................. G01N 23/00; G21K 7/00; H04N 9/54; H04N 9/60
[52] U.S. Cl. .................................. 250/306; 250/310; 358/92; 358/107
[58] Field of Search ................ 250/310, 311, 306; 358/92, 107

[56] References Cited

U.S. PATENT DOCUMENTS

| 2,786,096 | 3/1957 | Palmer | 358/107 |
| 3,585,382 | 6/1971 | Suganuma | 250/310 |
| 3,986,027 | 10/1976 | Holmes | 250/310 |

Primary Examiner—Alfred E. Smith
Assistant Examiner—T. N. Grigsby
Attorney, Agent, or Firm—Craig & Antonelli

[57] ABSTRACT

Apparatus capable of tridimensionally measuring the distance between two arbitrary points on the surface of a sample is disclosed. In apparatus wherein the surface of the sample to be observed is scanned with an energized beam, wherein a secondary radiation emitted from the sample is detected and wherein a sample image is displayed by making the detected signal a video signal, two sample images obtained by changing-over the incident angle of the beam on the sample surface are displayed, whereby the stereoscopic viewing of the sample surface is enabled. In this invention, there is added means for superposing and displaying marks at two positions of both the sample images as correspond to two arbitrary points on the sample surface and for automatically calculating the tridimensional distance between the two points on the sample surface on the basis of positioning signals of the marks.

5 Claims, 8 Drawing Figures

STEREOSCOPIC MEASURING APPARATUS

BACKGROUND OF THE INVENTION

1. Field of the Invention

This invention relates to improvements in apparatus for carrying out the stereoscopic observation of a sample surface, and more particularly to apparatus capable of tridimensionally measuring the distance between two arbitrary points on the sample surface. More specifically, this invention relates to apparatuses, for example, a scanning electron microscope (SEM), X-ray micro analyzer (XMA), ion micro analyzer (IMA), ultrasonic microscope etc., wherein a sample surface is irradiated by an energized beam such as electron beam, ion beam, light beam, X-ray beam and ultrasonic beam while being scanned, wherein a secondary radiation thus obtained, such as secondary electrons, transmitted electrons, secondary ions and X-rays, is detected and wherein the scanning image of the sample surface is displayed by making the detected signal a video signal, characterized in that marks for indicating positions are superposed and displayed at two arbitrary points on the displayed image and that the microscopic and tridimensional distance between the two points given by the marks is measured and displayed.

2. Description of the Prior Art

In measuring a minute distance on a sample surface with a scanning electron microscope (SEM) or the like, it has heretofore been common practice to superpose and display a measurement scale on a sample image expandedly displayed. With such method, a satisfactory measurement precision is not attained on account of the distortion of the displayed image, the error of the magnification, etc. Moreover, since the size of the measurement scale changes in dependence on the magnification, there is the inconvenience that the size of the measurement scale need be recalculated each time the magnification changes.

There has hitherto been known apparatus wherein the magnified image of a sample surface by an optical microscope is photographed by a TV camera and displayed on a Braun tube, two parallel straight lines are superposed and displayed on the image, and the distance between the two straight lines is digitally indicated. Even with this apparatus, the tridimensional distance between two arbitrary points on the sample surface cannot be measured in real time.

Further, there has been proposed a stereo scanning electron microscope (stereo SEM) which enables the stereoscopic observation of a sample surface by changing the irradiation angle of a primary electron beam on a sample (refer to U.S. Pat. No. 3,585,382). Even in this apparatus, it is not conducted to automatically measure the tridimensional distance between two arbitrary points on the sample surface in real time.

SUMMARY OF THE INVENTION

An object of this invention is to add a new measuring function to scanning type sample image displaying apparatus having heretofore been used mainly for merely observing the shape of a sample surface, for example, a scanning electron microscope, an X-ray micro analyzer and an ion micro analyzer, thereby making it possible to highly precisely and automatically measure an extremely small tridimensional distance or size.

In order to accomplish the object, in accordance with this invention, when an image is composed of a video signal obtained by scanning a sample with an irradiation beam, an identical area (field of view) of the sample is scanned by changing the incident angle of the irradiation beam on the sample into two values, and two images are thus displayed, whereby the stereoscopic viewing of the surface of the sample is enabled in the first place. Further, pulses are superposed on the video signal to add at least two marks indicative of positions to the sample image, the marks are moved to two arbitrary positions (to be noted) of the sample image, and the distance between two points indicated by the two marks is automatically evaluated from the voltage difference between two reference signals which are externally applied in order to determine the positions of both the marks on the sample image or from the time interval of two pulse signals which are applied to the sample image video signal in order to display both the marks.

In order to determine the position of the mark, a d.c. voltage is externally applied as a reference signal, the d.c. voltage and a saw-tooth wave for scanning the irradiation beam are compared, and a pulse signal for displaying the mark is generated when both are equal. Alternatively, the position of the mark can be determined in such way that pulses for displaying the mark are generated with a delay by an externally given period of time from a synchronizing signal for initiating the horizontal scanning or the vertical scanning.

When both the expedients are compared, the former has the merits that even when the saw-tooth wave is somewhat distorted, the display of an accurate position is attained, and that the distance between the two points can be comparatively simply evaluated from the difference of the d.c. voltages given as the references. The latter has the feature that it is less susceptible to the influence of a noise mixed in the saw-tooth wave or an induced voltage.

The positions of the respective marks can be moved by changing the reference voltages or by changing the delay times. It is therefore possible that while observing the sample image, the positions of the respective marks are cause to coincide with arbitrary positions on the sample image.

The tridimensional distances (i. e., distances in X, Y and Z directions) between the two marked points can be respectively and independently evaluated by relations to be stated hereunder. The horizontal scanning direction, the vertical scanning direction and the optic axis direction of a primary beam at the time when the sample is observed under the normal state are selected at coordinate axes $x$, $y$ and $z$, respectively.

Here, in order to stereoscopically view the sample surface, the primary beam is projected in directions respectively inclined by $+(\theta/2)$ radian and $-(\theta/2)$ radian from the $z$-axis direction about the $y$-axis, whereby two images are displayed. Subsequently, as to the two images, the distances between the same two points are measured. Assume that $dx_1$, $dy_1$, $dx_2$ and $dy_2$ have been thus obtained.

At this time, with respect to the normal coordinates, the distance $dx$ in the horizontal scanning direction, the distance $dy$ in the vertical scanning direction and the distance $dz$ in the optic axis direction are respectively given by:

$$dx = \frac{dx_1 + dx_2}{2\cos\frac{\theta}{2}} \simeq \frac{dx_1 + dx_2}{2} \quad (1)$$

$$dy = dy_1 = dy_2 \quad (2)$$

$$dz = \frac{dx_2 - dx_1}{2\sin\frac{\theta}{2}} \simeq \frac{dx_2 - dx_1}{\theta} \quad (3)$$

(The equations of approximations hold at $\theta \ll 1$.)

Needless to say, $dx$ and $dy$ are evaluated by measurements under the normal state under which the irradiation beam is not inclined.

In this way, the tridimensional distances $dx$, $dy$ and $dz$ between the two points on the sample surface can be respectively and independently evaluated. Further, from these values, the straight distance between the two points within the X-Y plane is evaluated by:

$$\sqrt{dx^2 + dy^2}$$

and the straight distance between the two points within the X-Y-Z space is evaluated by:

$$\sqrt{dx^2 + dy^2 + dz^2}$$

These operations can be easily realized by the combination of an analog squaring circuit, adder, square root circuit, etc.

DESCRIPTION OF THE EMBODIMENTS

Hereunder, this invention will be described in detail in connection with embodiments.

Figure 1:
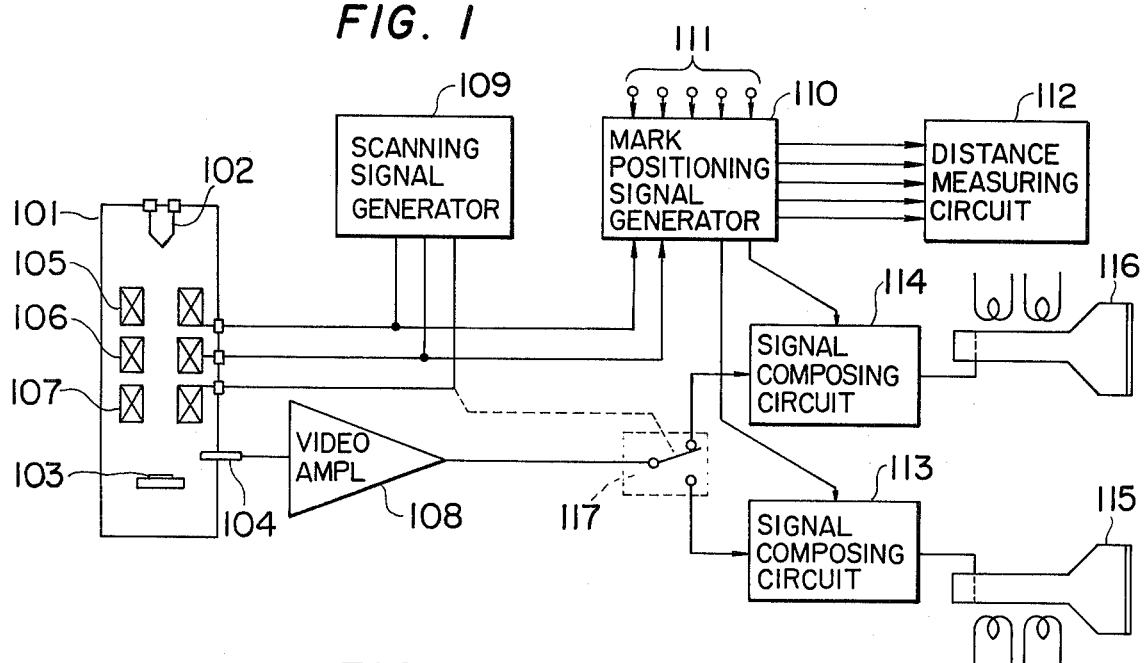
FIG. 1 is a block diagram showing the construction of an embodiment in the case where this invention is applied to a scanning electron microscope.

FIG. 1 is a block diagram of an embodiment in which this invention is applied to a scanning electron microscope (SEM). Referring to the figure, numeral 101 designates a body tube of the SEM, the interior of which is held at a vacuum. An electron beam emitted from an electron gun 102 and converged to be fine is deflected in the horizontal direction (X-direction) and the vertical direction (Y-direction) by deflecting coils 105 and 106, respectively, which are driven by a scanning signal generator 109, and it scans a certain field of view of a sample 103. Secondary electrons, reflected electrons, etc. generated at this time are detected by a detector 104. The detected signal is amplified by a video amplifier 108, and is used as a video signal for sample image display.

Here, in order to stereoscopically view the surface of the sample 103, a coil 107 for changing-over the incident angle of the electron beam on the sample is added. Two sample images under incident angles different from each other are individually displayed on two Braun tubes 115 and 116, and they are respectively observed by the left eye and the right eye at the same time. Thus, the stereoscopic vision is realized.

In order to obtain the two sets of images differing in the incident angle of the electron beam on the sample, it is also possible to adopt a system wherein the sample is mechanically inclined, images at the two inclination angles are stored into an image storage device such as memory tube, video tape recorder and video disk recorder, and the images are read out simultaneously or alternately and displayed on one or two Braun tubes. In a still further system, two electron guns are provided, and electron beams are brought into incidence on the sample at angles different from each other.

Referring again to FIG. 1, numeral 110 indicates a mark positioning signal generator which generates signals for determining the positions of marks on the sample image. Numeral 111 represents inputs for bestowing a reference signal. The mark positioning signal generator 110 compares an output waveform of the scanning signal generator 109 with the reference signal 111 and generates, when both coincide, signals indicative of the positions of the marks, i. e., mark positioning signals. These signals and the video signal are composed by signal composing circuits 113 and 114, and the marks indicating the positions are added to the image.

A change-over switch 117 functions so that, each time the incident angle of the electron beam on the sample 103 changes-over, the Braun tubes 115 and 116 for displaying the images are changed-over in interlocking therewith. By displaying the next image within the persistence times of the naked eye and the Braun tube, the flickering of the images can be reduced. Further, numeral 112 denotes a distance measuring circuit for evaluating the distance between two points endowed with the marks.

Regarding the shape and size of the mark, various ones are usable. As the shapes, there are a cross, a circle, a triangle, a square, etc. When the size is too small, it is difficult to be distinguished from a noise of the image, whereas when it is too large, it becomes an obstacle to the observation of the image. For these reasons, there are suitable dimensions. As the result of an actual measurement, where a 12-inch Braun tube was used, a square whose one side was 1 mm long was suitable as the mark. A pulse width for displaying the mark is 0.26 $\mu$s in terms of the scanning speed of the ordinary television.

Figure 2:
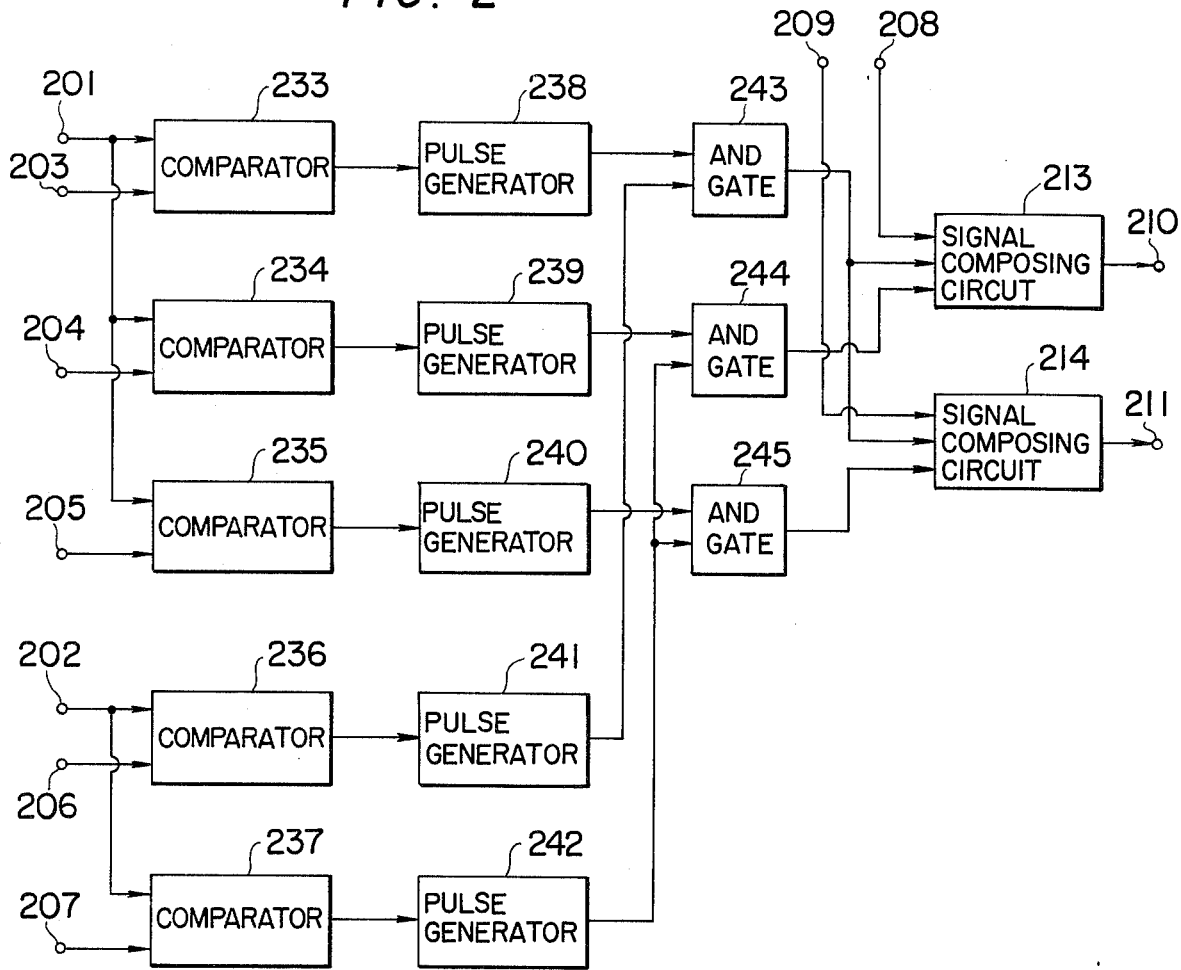
FIG. 2 is a block diagram showing an example of construction of a mark positioning signal generator in the apparatus shown in FIG. 1.
Figure 3:
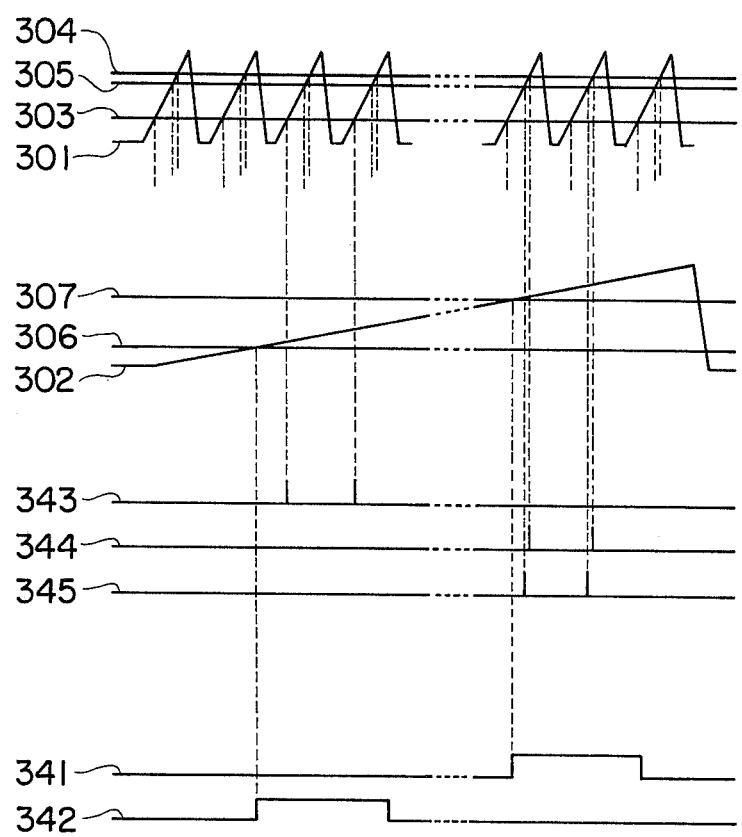
FIG. 3 is a time chart for explaining the operation of the circuit shown in FIG. 2.

FIG. 2 is a block diagram showing an example of concrete construction of the mark positioning signal generator 110 and the signal composing circuits 113, 114 in FIG. 1, while FIG. 3 is a time chart showing the operations of various parts in the circuitry.

A horizontal deflection signal of a waveform 301 illustrated in FIG. 3 is impressed on a terminal 201 in FIG. 2, and d.c. reference voltages 303, 304 and 305 are respectively impressed on terminals 203, 204 and 205. They are compared by comparators 233, 234 and 235. When both the voltage values coincide, pulses of a width of, for example, 0.26 μs are generated from pulse generators 238, 239 and 240, respectively.

Further, a vertical deflection signal of a waveform 302 is impressed on a terminal 202, and d.c. reference voltages 306 and 307 are respectively impressed on terminals 206 and 207. They are compared by comparators 236 and 237. When both the voltage values coincide, pulses of a width of, for example, 125 μs as have waveforms 341 and 342 are generated from pulse generators 241 and 242, respectively.

The pulse outputs of the pulse generators 238, 239 and 240 become pulses of waveforms 343, 344 and 345 via AND gates 243, 244 and 245, respectively. These pulses are applied to signal composing circuits 213 and 214 and are combined with two video signals applied to terminals 208 and 209, and the outputs are provided at terminals 210 and 211. Therefore, by applying these outputs to the two Braun tubes 115 and 116 in FIG. 1, the images to which the marks indicative of the positions are added can be stereoscopically viewed.

In FIG. 2, the output of the AND gate 243 becomes common inputs to both the signal composing circuits 213 and 214. That is, the first mark indicating the position moves on the screens of the Braun tubes 115 and 116 in interlocking. This assumes that the relative positions of the two images for the stereoscopic vision can be moved. The first mark is accordingly common to both the images. In general, however, the AND gate delivers two independent output signals, and four signals including the outputs of the AND gates 244 and 245 are required in total. In such general case, four reference signals are required instead of the reference signals 303, 304 and 305 in FIG. 3. As understood from the fact that the output of the AND gate 244 and the output of the AND gate 245 are respectively entered into the signal composing circuit 213 and the signal composing circuit 214, the second mark moves independently. Therefore, a parallax due to the stereoscopic vision or viewing is given by the difference between the d.c. reference voltages 304 and 305 respectively applied to the terminals 204 and 205. Thus, the operation of the aforecited Eq. (3) is executed, and the distance in the Z-axis direction is evaluated. In this case, if the difference between the incident angles of the electron beam is set at such angles as 5° 44 minutes and 11° 28 minutes, $\theta$ will become equal to 0.1 and 0.2, respectively, and the operation of Eq. (3) will be simplified.

Figure 4:
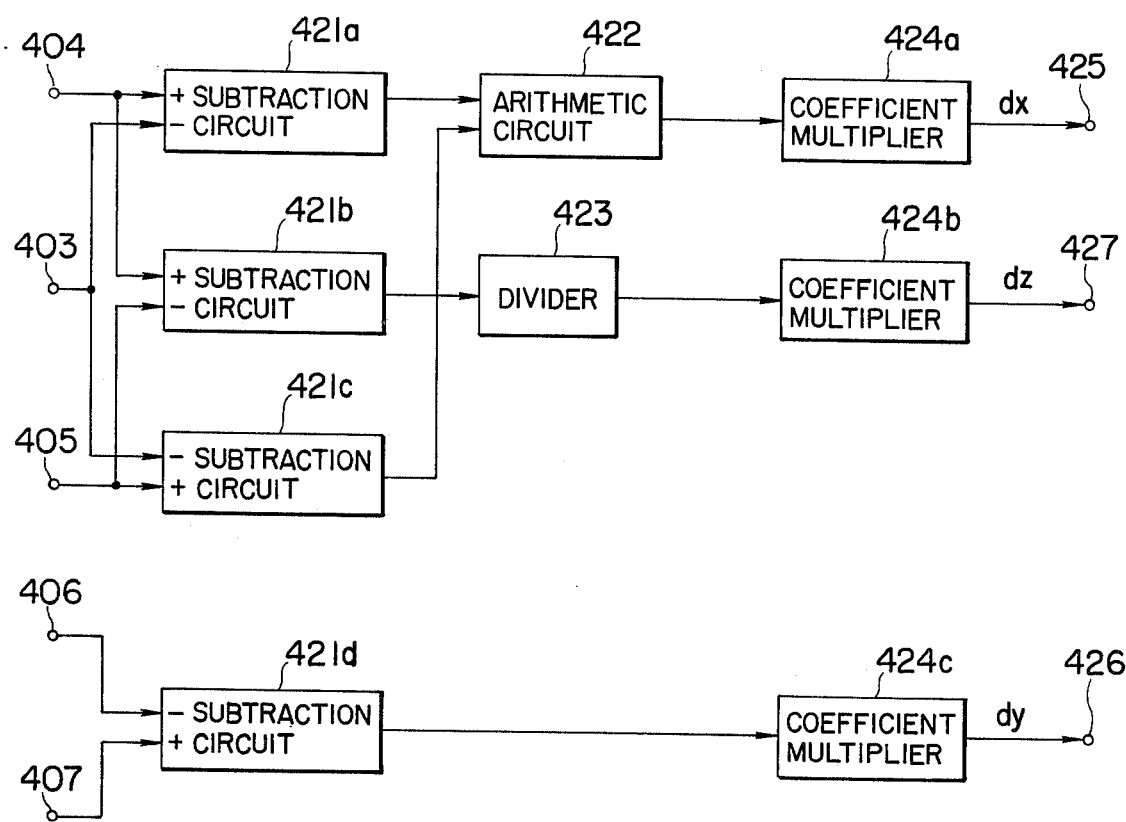
FIG. 4 is a block diagram showing an example of construction of a distance measuring circuit in the embodiment shown in FIG. 1.

FIG. 4 shows a concrete embodiment of a circuit for evaluating the distance between the two points given by the marks, that is, the distance measuring circuit 112 in FIG. 1. Here, the distance is evaluated from reference signals of d.c. voltages which are externally applied in order to determine the positions of the marks.

Referring to the figure, input terminals 403 – 407 correspond to the input terminals 203 – 207 in FIG. 2 and receive the d.c. voltages to become the reference signals. 421a – 421d are subtraction circuits, which execute operations in accordance with illustrated symbols. An arithmetic circuit 422 averages two inputs, in other words, adds the two inputs and divides the sum by two. A divider 423 executes the operation of the division by $\theta$ according to Eq. (3).

424a – 424c indicate coefficient multipliers, which automatically multiply inputs by coefficients determined from the multiplying factor of the images. By reading the products, the distances are evaluated. An output terminal 425 provides the distance in the horizontal scanning direction, an output terminal 426 that in the vertical scanning direction, and an output terminal 427 that in the height direction. When analog multipliers are used as the coefficient multipliers 424a – 424c and the scale based on the multiplying factor is bestowed by a d.c. voltage, analog outputs proportional to the distances are obtained at the outputs. Here, when the coefficient multipliers 424a – 424c are caused to effect the analog-to-digital conversion action and the quantization level is bestowed by the scale determined by the multiplying factor, the distances are automatically indicated by digital values.

Figure 5:
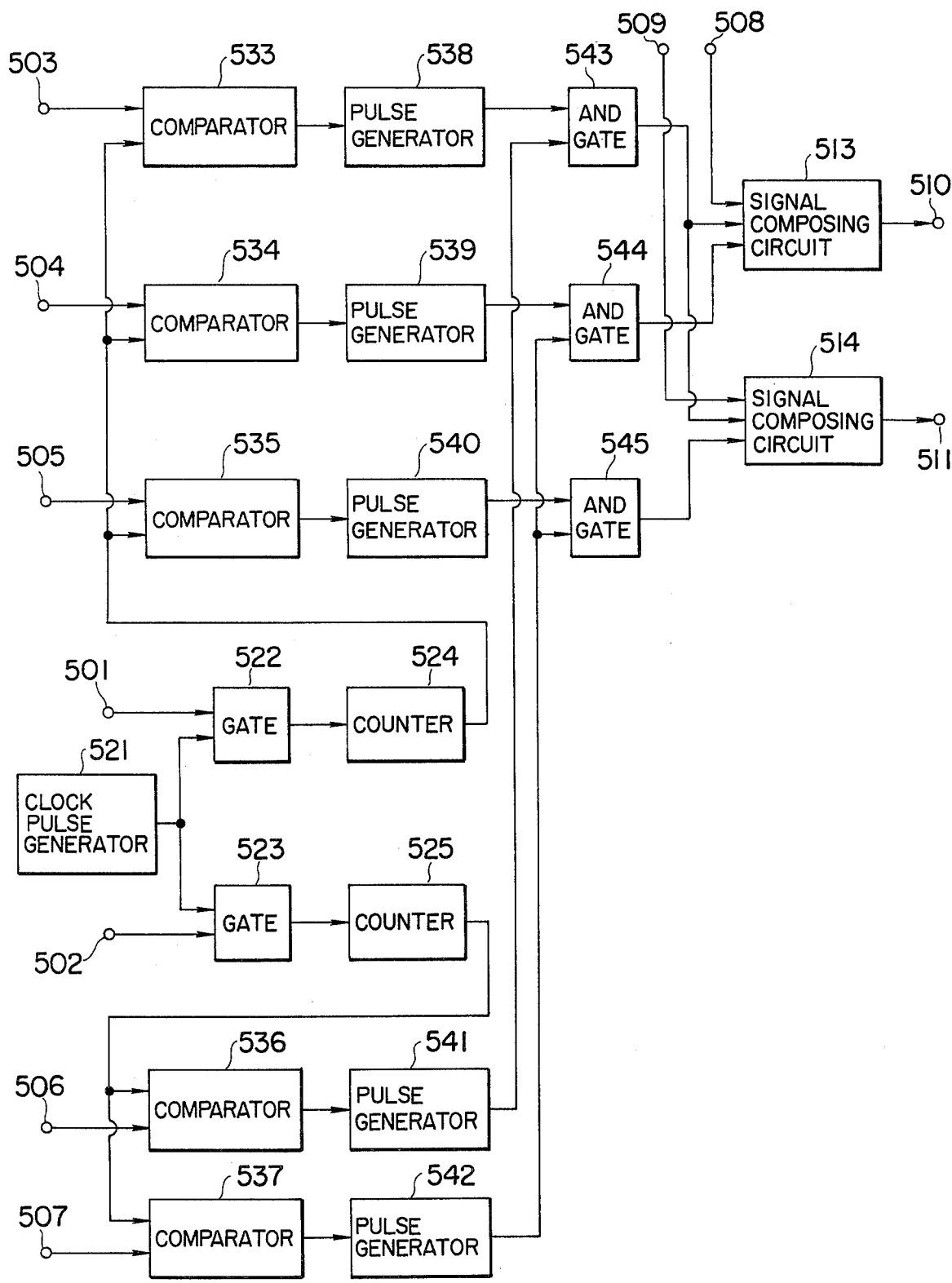
FIG. 5 is a block diagram showing another example of construction of the mark positioning signal generator in the apparatus shown in FIG. 1.
Figure 6:
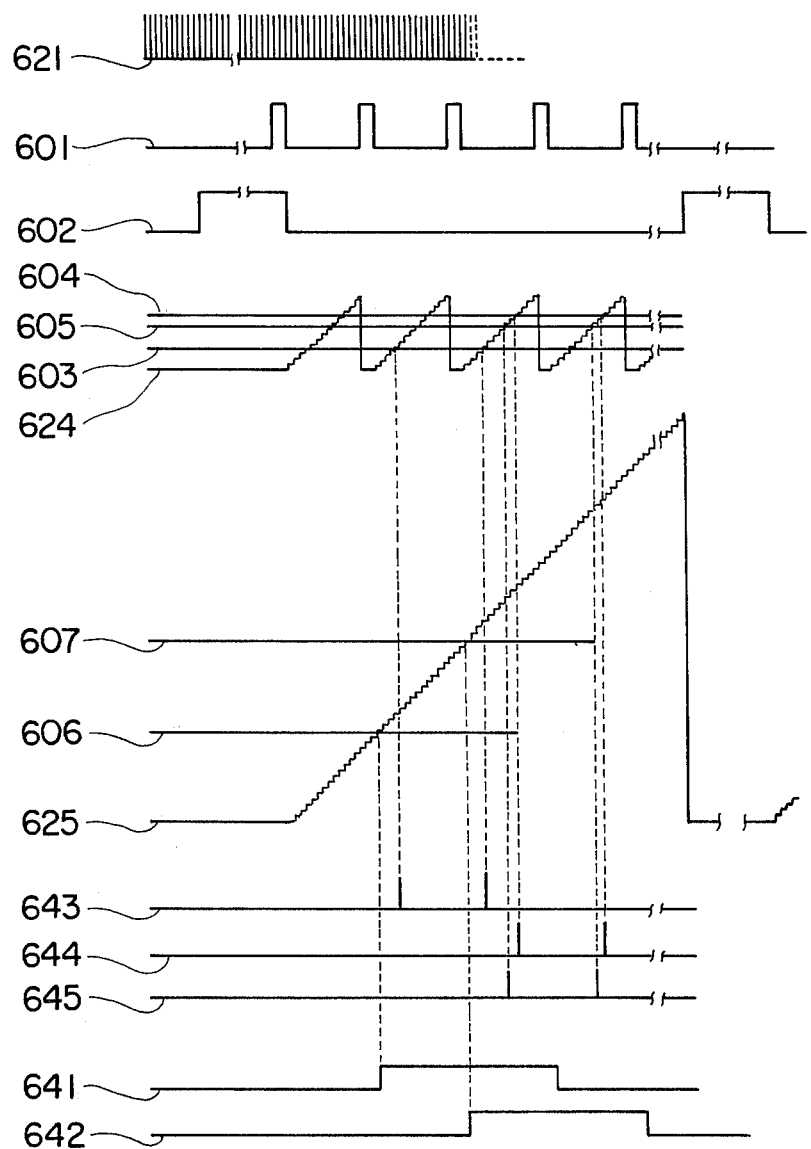
FIG. 6 is a time chart for explaining the operation of the circuit shown in FIG. 5.

FIG. 5 shows an embodiment of the mark positioning signal generator different from that in FIG. 2, and illustrates a further example of concrete construction of the mark positioning signal generator 110 and the signal composing circuits 113, 114 in FIG. 1. FIG. 6 is a time chart showing the operations of various parts. The embodiment herein stated is of a digital system in which pulses are generated from synchronizing signals of the horizontal scanning and the vertical scanning with a delay by the number of clock pulses externally impressed.

Terminals 501 and 502 in FIG. 5 receive horizontal and vertical synchronizing signals shown by waveforms 601 and 602 in FIG. 6, respectively. A clock pulse generator 521 generates clock pulses 621. The clock pulses are counted by counters 524 and 525 through gates 522 and 523 which are opened by the synchronizing signals, respectively. Thus, outputs 624 and 625 which correspond to the respective count values are generated.

Input signals 603 – 607 equivalent to the numbers of pulses for the delays are externally applied to terminals 503 – 507, respectively. They are compared with the respective outputs 624, 625 of the counters 524, 525 by comparators 533 – 537. When both are coincident, pulses are generated from pulse generators 538 – 542, and pulses 643, 644, 645 are obtained via AND gates 543, 544, 545. These pulses are applied to signal composing circuits 513, 514 and are combined with two video signals applied to terminals 508, 509. Outputs of waveforms 641, 642 are transmitted from pulse generators 541, 542. The output signals are applied to AND gates 543, 544, 545. The position of the mark in the vertical scanning direction is determined by outputs of the AND gates.

Since the movement of the relative positions of the two images for the stereoscopic viewing is assumed also here, the first mark is common to both the images. In general, however, the AND gate 543 delivers two independent output signals, and four signals consisting of the two signals and the outputs of the AND gates 544 and 545 are required. At this time, four reference signals are required instead of those 603, 604 and 605 in FIG. 6.

A circuit for evaluating the distance between the two points indicated by the marks obtained by the circuit of the above embodiment has the same construction as in FIG. 4. However, when the numbers of clock pulses for the delays are bestowed by digital values, e. g., binary numbers, the subtraction circuit 421 becomes a binary subtractor, and the circuits 422 and 423 execute the averaging and division of binary numbers. The circuits 424a – 424c become binary multipliers which conduct the multiplications of coefficients determined from the scale. As the binary coefficient multipliers, there are known several types such as a multiplier executing additions repeatedly with an adder, a parallel multiplier, and a serial multiplier.

Figure 7:
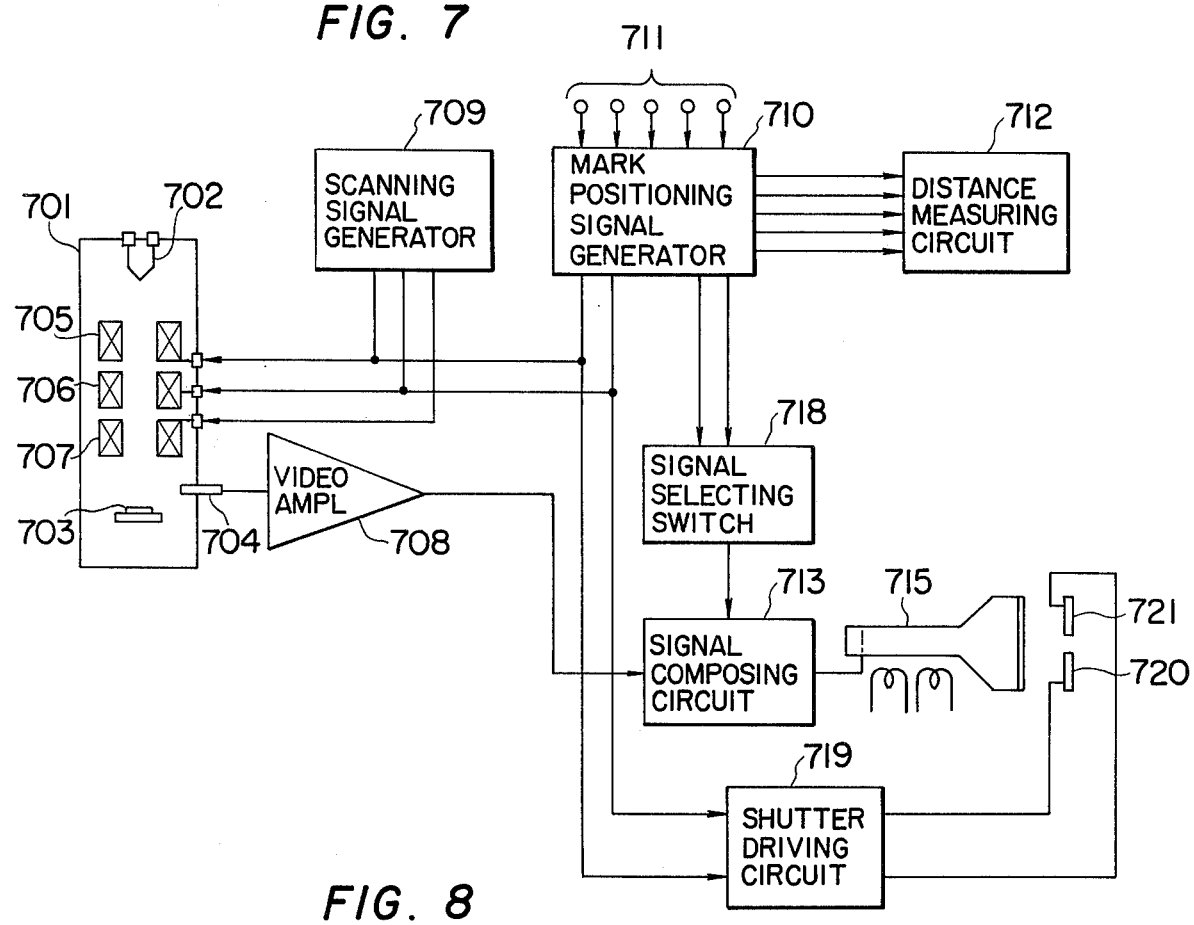
FIG. 7 is a block diagram showing the construction of another embodiment in the case where this invention is applied to the scanning electron microscope.

FIG. 7 is a block diagram of another embodiment in which this invention is applied to a scanning electron microscope. The point of difference of this embodiment from the embodiment of FIG. 1 resides in that, in order to realize the stereoscopic vision, two images differing in the incident angle of an electron beam are displayed on a single Braun tube 715 alternately in time-sharing and that a stereoscopic image is observed through two electrooptic shutters 720 and 721 which are opened and closed in synchronism with the alternate displays and in correspondence with the displayed images.

Here, numeral 701 designates a body tube, numeral 702 an electron gun, numeral 703 a sample, and numeral 704 a detector for a video signal, an output of which is amplified by a video amplifier 708. Numerals 705, 706 and 707 indicate deflecting coils which cause an electron beam to scan and which change its incident angle on the sample. The deflecting coils are driven by a deflection circuit 709. Numeral 710 denotes a mark positioning signal generator, and numeral 711 inputs for bestowing reference signals. A circuit 712 for evaluating the distance between two points given by marks is the same as the circuit 112 in the previous embodiment. Signals of the marks indicative of positions, i. e., positioning signals are selected by a switch 718 according to an image displayed, the selected signal is composed into the video signal by a signal composing circuit 713, and it is displayed on the Braun tube 715. In dependence on whether the displayed image is to be seen by the left eye or by the right eye, one of the electrooptic shutters 720 and 721 transmits light, and the other intercepts light. Thus, the images falling on the eyes of the observer are separated. The electrooptic shutters are driven by a shutter driving circuit 719 in synchronism with the images and in the manner described above.

Here, the electrooptic shutter is so constructed that transparent ceramics called PLZT, for example, is held between orthogonal polarizer plates. It is operated by applying an electric field to the ceramics.

In the above embodiment, the images for both the eyes are displayed on the single Braun tube. Therefore, the distortion of the image or the difference of the brilliance as arises in the case of employing two Braun tubes does not occur, so that errors in the measurement of the distance are little. In addition, the images for both the eyes lie at substantially the same positions, so that the situation is close to the state under which an ordinary object is seen. The period of time for obtaining a stereoscopic feeling is shorter than in case of synthesizing two images with a stereoscope or a half-mirror, and the fatigue is little even at the observation over a long time.

Figure 8:
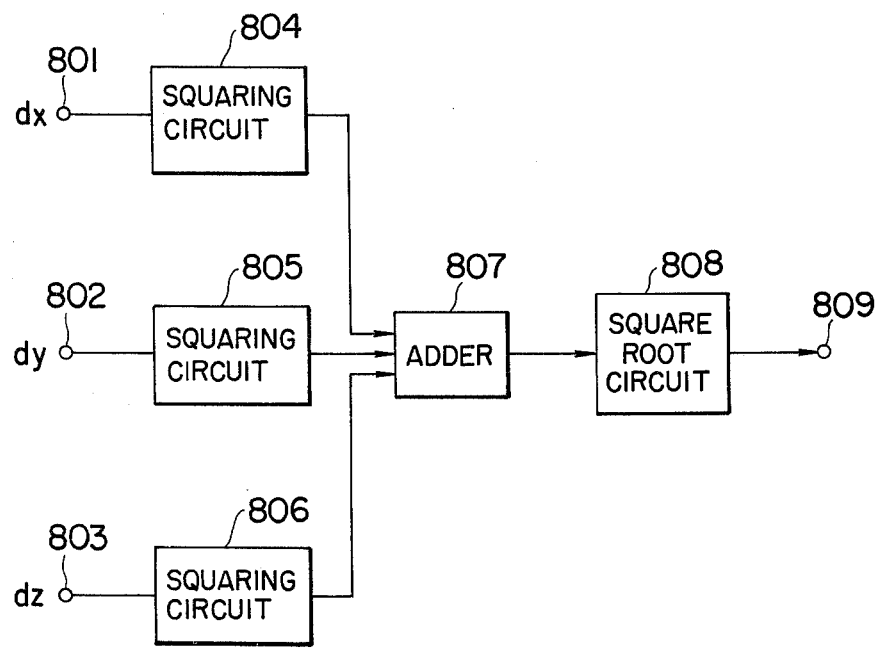
FIG. 8 is a block diagram showing an example of construction of a circuit for evaluating a straight distance from tridimensional distances respectively and independently evaluated by the distance measuring circuit as shown in FIG. 4.

FIG. 8 is a block diagram of an embodiment in which a straight distance $\sqrt{dx^2 + dy^2 + dz^2}$ is evaluated from three tridimensional distance values $dx$, $dy$ and $dz$ respectively obtained independently. Referring to the figure, numerals 801, 802 and 803 designate inputs of $dx$, $dy$ and $dz$, respectively. Numerals 804, 805 and 806 designate squaring circuits. Numeral 807 indicates a three-input adder, and numeral 808 a square root circuit. An output of the straight distance is provided at an output terminal 809. Owing to the arrangement, apparatus for obtaining an analog output by employing analog inputs and analog squaring circuits, adder and square root circuit can be simply constructed. Even when digital elements are used, similar apparatus is obtained in the same construction.

As set forth above, in accordance with this invention, in apparatus wherein a sample is scanned by an irradiation beam, wherein an image is constructed of a video signal obtained at this time and wherein the image is observed, an identical field of view of the sample is scanned by varying the incident angle of the irradiation beam and the two images are displayed and stereoscopically viewed, and further, pulses are superposed on the video signal, marks indicative of positions are added to the image, distances between two points designated by the marks are automatically measured by an electrical system and operations are conducted on the distances, thereby making it possible to separately measure tridimensional components of the distance between the two points. In this manner, the invention opens the way along which sample image displaying apparatus having heretofore been used mainly for the observation of a shape is developed into a measuring instrument for measuring a tridimensional size being so extremely small as to be close to the resolution.

We claim:

1. Stereoscopic measuring apparatus, comprising:
   means to irradiate a surface of a sample with an energized beam converged to be fine,
   means to cause said beam to scan the sample surface,
   means to detect secondary information of said sample as obtained by the irradiation with said beam,
   means to display an image of said sample by making an output signal of the detection means a video signal,
   means to change-over an incident angle of said beam on said sample surface,
   means to superpose and display marks at two positions on each of the two sample images obtained by the change-over of said incident angle of said beam, said two positions corresponding to two arbitrary points on said sample surface, and
   means to calculate a distance between said two points on said sample surface on the basis of positioning signals of said marks.

2. The apparatus according to claim 1, wherein the sample image display means is composed of two display devices which individually display said two sample images obtained by the change-over of said incident angle of said beam on said sample surface.

3. The apparatus according to claim 1, wherein the sample image display means is composed of a single display device which alternately displays said two sample images.

4. The apparatus according to claim 1, wherein the mark display means comprises means to compare a scanning deflection voltage of the sample image display means and a reference voltage and to generate a mark displaying pulse signal when both said voltages coincide, and means to combine said pulse signal with said video signal.

5. The apparatus according to claim 4, wherein the distance calculating means calculates said distance between said two points on said sample on the basis of said reference voltage.

* * * * *